(12) United States Patent
Ogawa et al.

(10) Patent No.: US 6,307,737 B1
(45) Date of Patent: Oct. 23, 2001

(54) CORD SETTLER

(75) Inventors: Masuo Ogawa; Tomoaki Kibino; Kaoru Deguchi, all of Daito (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 09/429,059

(22) Filed: Oct. 29, 1999

(30) Foreign Application Priority Data

Nov. 4, 1998 (JP) .................................................. 10-008668
Sep. 27, 1999 (JP) .................................................. 11-007317

(51) Int. Cl.⁷ ............................... H05K 5/02; H04N 5/64
(52) U.S. Cl. ..................... 361/682; 361/681; 361/679; 348/843
(58) Field of Search ............................ 361/679, 724, 361/736, 681, 682; 348/794, 836, 843; 345/905; 312/223.1, 223.6, 351.1, 352, 7.2; 174/168, 169, 175; D8/356, 382, 394–396, 354, 367, 115 R, 129 R, 130

(56) References Cited

U.S. PATENT DOCUMENTS

| | | | | |
|---|---|---|---|---|
| D. 275,174 | * | 8/1984 | Rolli ...................................... D8/356 |
| D. 373,525 | * | 9/1996 | Roethler ................................ D8/367 |
| 3,879,812 | * | 4/1975 | Clinch ............................ 24/230.5 TP |
| 4,062,430 | * | 12/1977 | Momberg ........................... 191/12 R |
| 4,067,526 | * | 1/1978 | Storer ..................................... 248/65 |
| 4,133,971 | * | 1/1979 | Boyd et al. ............................. 174/46 |
| 4,536,052 | * | 8/1985 | Baker et al. ...................... 339/126 R |
| 4,852,495 | * | 8/1989 | Hancock et al. ..................... 102/306 |
| 5,168,598 | * | 12/1992 | Hashizume et al. .................... 15/323 |
| 5,209,478 | * | 5/1993 | Simpson .......................... 273/148 B |
| 5,303,447 | * | 4/1994 | McKnight ............................... 15/323 |
| 5,318,158 | * | 6/1994 | Seasholtz ............................ 191/12 R |
| 5,331,714 | * | 7/1994 | Essex et al. ........................... 15/323 |
| 5,577,932 | * | 11/1996 | Palmer ................................. 439/501 |
| 5,649,340 | * | 7/1997 | Ida ................................... 24/115 G |
| 5,683,199 | * | 11/1997 | Tehan .................................. 403/314 |
| 5,710,600 | * | 1/1998 | Ishii et al. ............................ 348/563 |
| 5,992,788 | * | 11/1999 | Glass ................................ 242/400.1 |
| 6,012,940 | * | 1/2000 | Wheeler ............................... 439/369 |

FOREIGN PATENT DOCUMENTS

| | | |
|---|---|---|
| 58-111981 | 1/1982 | (JP) . |
| 58-123982 | 2/1982 | (JP) . |
| 6-32394 | 5/1985 | (JP) . |
| 61-188203 | 5/1985 | (JP) . |
| 62-145898 | 12/1985 | (JP) . |
| 3-41980 | 9/1989 | (JP) . |
| 4-96718 | * 3/1992 | (JP) .................................... 15/246.2 |
| 6-30097 | * 2/1994 | (JP) .................................... 379/454 |

* cited by examiner

*Primary Examiner*—Leo P. Picard
*Assistant Examiner*—Anatoly Vortman
(74) *Attorney, Agent, or Firm*—Lackenbach Siegel

(57) ABSTRACT

A cord settler capable of preventing a cord from being caught under a television set is obtained. In this cord settler, a hook body is formed on the back of a back cabinet of a television set a position of a prescribed height from the bottom of the back cabinet integrally with the back cabinet. The hook body has a substantially cylindrical shape. The cord is hung on the hook body to be prevented from suspending due to the aforementioned structure, whereby the cord can be effectively prevented from being caught under the television set. The hook body is so cylindrically formed that the mechanical strength of the hook body is remarkably improved as compared with that formed in another shape. Even if the cord hung on the hook body is pulled, therefore, the hook body can be prevented from being broken or bent.

10 Claims, 8 Drawing Sheets

CORD SETTLER

BACKGROUND OF THE INVENTION

1. Field of the Invention

The present invention relates to a cord settler, and more specifically, it relates to a cord settler for a television set such as a general television or a television provided with a video recorder.

2. Description of the Prior Art

An AC cord of a television set such as a general television or a television provided with a video recorder is generally drawn out from a bottom front side of the television set (bottom front part of a back cabinet) for the following reason: A flyback transformer stored in the television set is arranged on a position as separated as possible from a CRT provided on the front of the television set, in order to avoid interference with the CRT. Therefore, the flyback transformer is generally arranged on a rear part of the back cabinet.

The flyback transformer and a power supply part must be arranged with a prescribed space in consideration of safety. Therefore, the power supply part is arranged on the front part of the back cabinet (front side of the television set). Thus, the AC cord connected with the power supply part of the television set is generally drawn out from the bottom front part of the back cabinet (bottom front side of the television set).

The AC cord of the conventional television set, which is generally drawn out from the bottom front part of the back cabinet as described above, is disadvantageously readily caught under the television set. When the AC cord is caught under the television set for a long time, the coating for the AC cord may be disadvantageously broken to result in short-circuiting.

SUMMARY OF THE INVENTION

An object of the present invention is to provide a cord settler capable of preventing a cord from being caught under a television set (electric apparatus).

Another object of the present invention is to improve mechanical strength in the aforementioned cord settler.

Still another object of the present invention is to stably hold the cord in the aforementioned cord settler.

A cord settler according to an aspect of the present invention comprises a hook body, a notched part and a recessed part. The hook body is formed on the back of a back cabinet of a television set on a position of a prescribed height from the bottom of the back cabinet integrally with the back cabinet, and has a substantially cylindrical shape. The notched part is formed on a base portion of the hook body for receiving a cord. The recessed part is formed from the notched part of the hook body toward the forward end of the hook body, for holding the cord. The "substantially cylindrical shape" is a concept including not only a cylindrical shape but also a polygonal tubular shape which can be substantially regarded as cylindrical. In relation to the present invention, the "television set" is a wide concept including not only a general television but also a television provided with a video recorder.

In the cord settler according to this aspect, the hook body is formed on the back of the back cabinet of the television set on the position of a prescribed height from the bottom of the back cabinet as described above, whereby it is possible to prevent the cord from suspending by hanging the cord on the hook body. Thus, the cord can be effectively prevented from being caught under the television set. Further, the mechanical strength of the cylindrically formed hook body can be remarkably improved as compared with that formed in another shape. Thus, even if the cord hung on the hook body is pulled, the hook body can be prevented from being broken or bent. In addition, the cord can be prevented from unexpected deviation by forming the recessed part from the notched part toward the forward end of the hook body and fitting the cord in the recessed part. Consequently, the cord can be held in a stable state.

In the structure of the cord settler according to the aforementioned aspect, a reinforcing rib may be provided on the outer peripheral surface of the cylindrical portion of the hook body. Thus, the mechanical strength of the hook body can be further improved. Consequently, the hook body can be further effectively prevented from being broken or bent also when the cord hung on the hook body is pulled.

In the structure of the cord settler according to the aforementioned aspect, a reinforcing rib may be provided on the inner surface of the cylindrical portion of the hook body. Thus, the mechanical strength of the hook body can be further improved. Consequently, the hook body can be further effectively prevented from being broken or bent also when the cord hung on the hook body is pulled. When the aforementioned reinforcing rib provided on the outer peripheral surface of the cylindrical portion of the hook body is combined with the aforementioned reinforcing rib provided on the inner surface of the cylindrical portion of the hook body, the mechanical strength of the hook body can be further improved as compared with the case of singly providing either reinforcing rib.

In the structure of the cord settler according to the aforementioned aspect, the base portion of the hook body may have a substantially semi-cylindrical shape so that the semi-cylindrical base portion is integrally connected to the back cabinet. When the cord hung on the hook body is pulled, the hook body can be effectively prevented from being broken along the base portion thereof by forming the base portion of the hook body in a semi-cylindrical shape having high mechanical strength.

The cord settler according to the aforementioned aspect preferably further comprises a guide groove formed over a bottom front part and a bottom rear part of the back cabinet for guiding the cord. The cord is preferably drawn out from the bottom front part of the back cabinet, guided to the bottom rear part of the back cabinet along the guide groove and thereafter held in the recessed part of the hook body. Thus, the cord drawn out from the bottom front part of the back cabinet is readily guided to the bottom rear part of the back cabinet along the guide groove without being caught under the television set due to the guide groove provided over the front part and the bottom rear part of the back cabinet. The cord is drawn out from the bottom rear part the back cabinet and held in the recessed part of the hook body in a state pulled upward, and hence can be prevented from suspending. Therefore, the cord can be prevented from being caught under the television set. Thus, the cord can be prevented from being caught under the television set due to the interaction of the guide groove and the recessed part of the hook body.

In the structure of the cord settler according to the aforementioned aspect, the section of the cord may have a substantially rectangular shape having a shorter side and a longer side, and in this case, the length of the notched part of the hook body is preferably larger than the length of the cord along the shorter edge and smaller than the length of the cord along the longer side. Thus, the cord is inserted in the notched part from the shorter side thereof and then rotated by 90° to be fitted in the recessed part from the shorter side thereof. Thus, also when the cord moves from the recessed part toward the notched part, the forward end of the cord is held in the recessed part since the length of the notched part is smaller than the length of the cord along the longer side. Consequently, the cord can be effectively prevented from deviating from the notched part also when moving from the recessed part toward the notched part.

In the structure of the cord settler according to the aforementioned aspect, the section of the cord may have a substantially rectangular shape having a shorter side and a longer side, and in this case, the groove width of the recessed part of the hook body is preferably larger than the length of the cord along the shorter side and smaller than the length of the cord along the longer side. When the cord is fitted in the recessed part from the shorter side thereof, the recessed part holds the cord with a certain degree of clearance between the recessed part and the cord due to the aforementioned structure. Thus, the coating of the cord can be prevented from damage by the recessed part. When the cord fitted in the recessed part is pulled, the cord is twisted to fill up the clearance between the recessed part and the cord. Thus, the cord can be effectively prevented from deviation also when pulled, and can be stably held as a result.

In the structure of the cord settler according to the aforementioned aspect, the forward end of the hook body may be formed in a cylindrical shape having a bottom. Thus, a male die and a female die will not come into contact with each other on the forward end of the hook body in molding, whereby molding can be readily performed. Further, the mechanical strength of the hook body can be further improved by the aforementioned bottom.

In the structure of the cord settler according to the aforementioned aspect, the section of the cord may have a substantially rectangular shape having a shorter side and a longer side, and in this case, the groove length of the recessed part is preferably substantially equal to the length of the cord along the longer side thereof. In the structure of the cord settler according to the aforementioned aspect, further, an opening is preferably formed on a portion of the back cabinet corresponding to the hook body. This opening is necessary on a molding process as a hole for receiving a die part for molding the hook body when integrally molding the hook body and the back cabinet.

A cord settler according to another aspect of the present invention comprises a hook body, a notched part and a recessed part. The hook body is formed on the back of an apparatus body of an electric apparatus on a position of a prescribed height from the bottom of the apparatus body integrally with the apparatus body, and has a substantially cylindrical shape. The notched part is formed on a base portion of the hook body for receiving a cord. The recessed part is formed from the notched part of the hook body toward the forward end of the hook body, for holding the cord.

In the cord settler according to this aspect, the hook body is formed on the back of the apparatus body of the electric apparatus on the position of a prescribed height from the bottom of the apparatus body as described above, whereby it is possible to prevent the cord from suspending by hanging the cord on the hook body. Thus, the cord can be effectively prevented from being caught under the electric apparatus. Further, the mechanical strength of the cylindrically formed hook body can be remarkably improved as compared with that formed in another shape. Thus, even if the cord hung on the hook body is pulled, the hook body can be prevented from being broken or bent. In addition, the cord can be prevented from deviation by forming the recessed part from the notched part toward the forward end of the hook body and fitting the cord in the recessed part. Consequently, the cord can be held in a stable state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the accompanying drawings.

Figure 1:
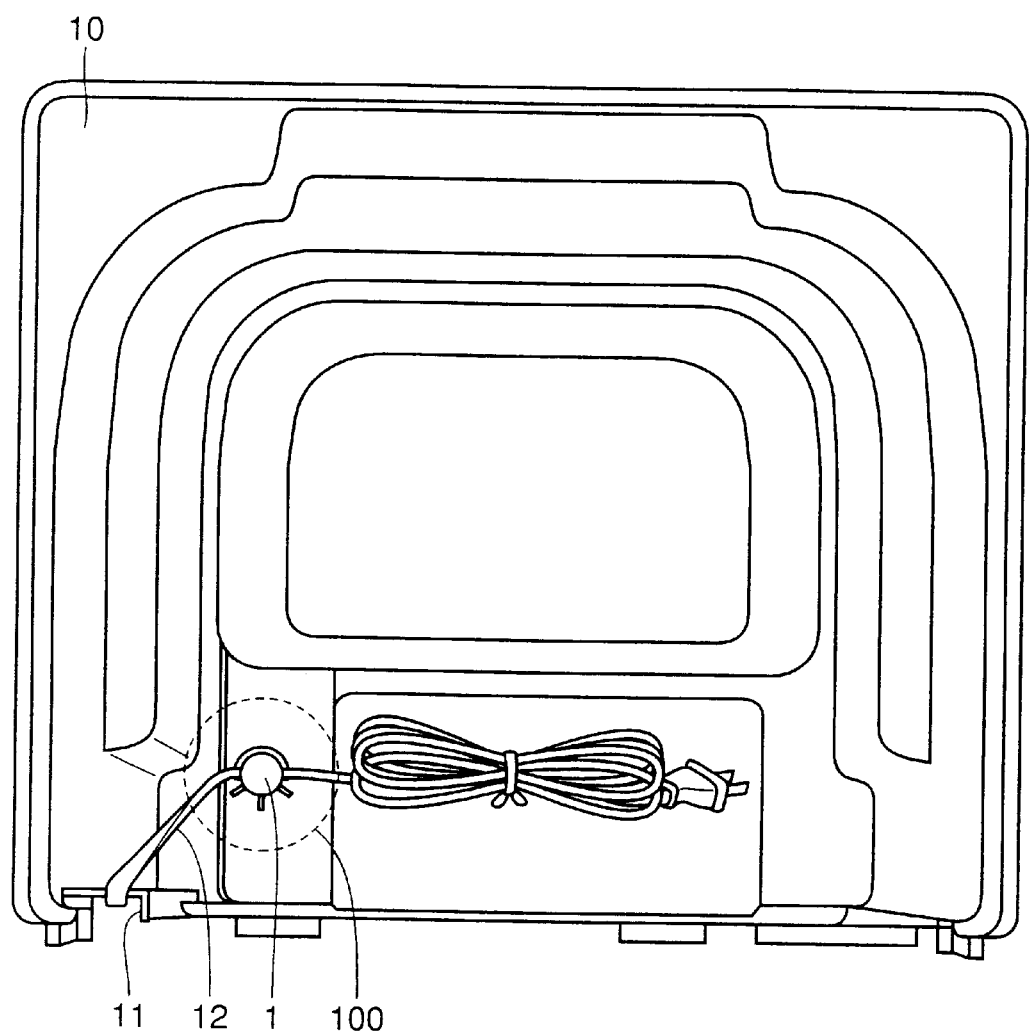
FIG. 1 is a rear elevational view showing a back cabinet of a television set having a cord settler according to an embodiment of the present invention.
Figure 2:
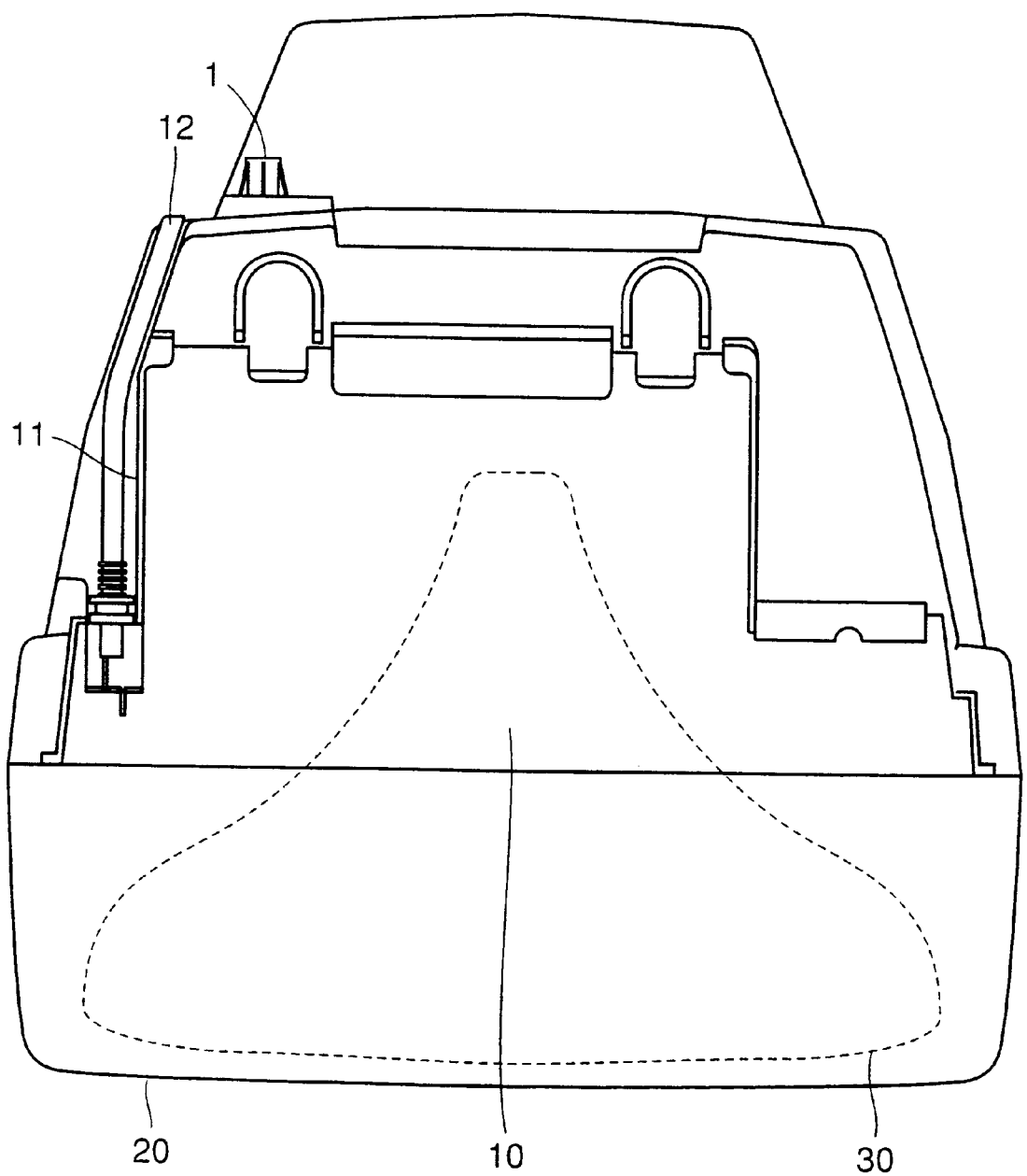
FIG. 2 is a bottom plan view of the back cabinet and a front cabinet of the television set shown in FIG. 1.

Referring to FIGS. 1 to 4, a hook body 1 is formed on the back of a back cabinet 10 of a television set such as a general television or a television provided with a video recorder in a cord settler according to the embodiment of the present invention. In more detail, the hook body 1 is formed on the back of the back cabinet 10 on a position of a prescribed height from the bottom of the back cabinet 10 integrally with the back cabinet 10. The hook body 1 is formed in a cylindrical shape having a bottom on the forward end. As shown in FIG. 2, the rear cabinet 10 is fitted with a front cabinet 20 to form a total cabinet. The front cabinet 20 supports a CRT (cathode ray tube) 30.

Figure 3:
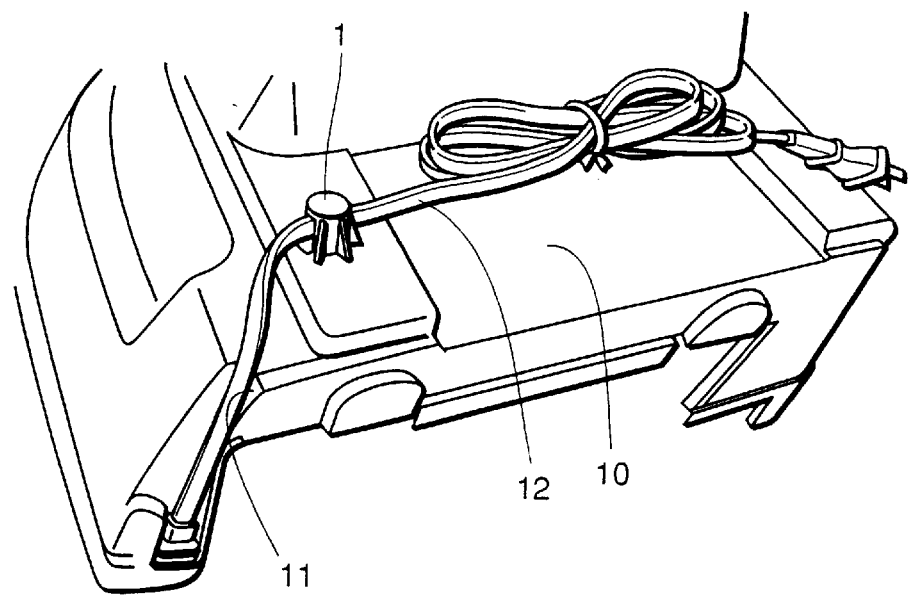
FIG. 3 is a perspective view of the back cabinet of the television set shown in FIG. 1.
Figure 4:
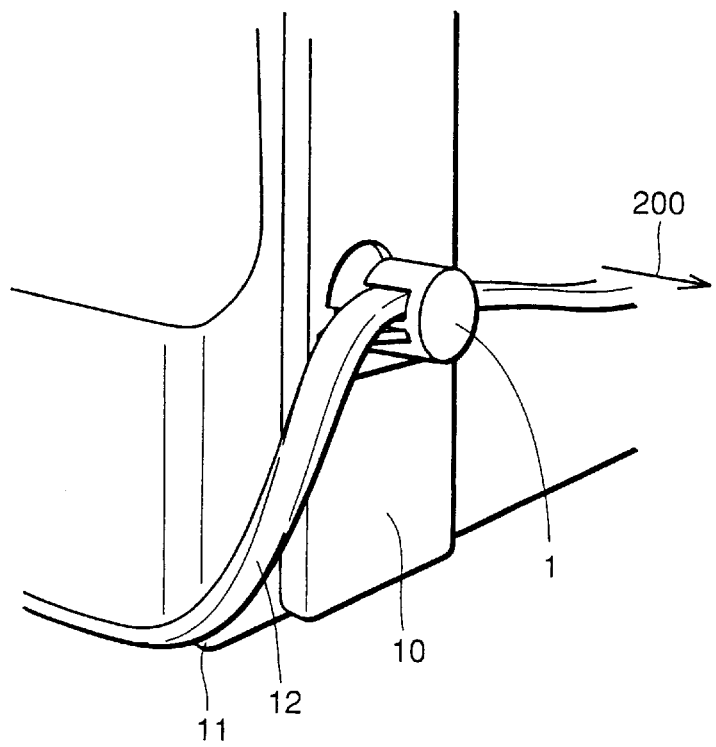
FIG. 4 is another perspective view of the back cabinet of the television set shown in FIG. 1.

As shown in FIGS. 2 and 3, a guide groove 11 is formed over the front part and the rear part of the bottom end of the back cabinet 10 for guiding an AC cord 12. The guide groove 11 is formed to have a depth larger than the thickness of the AC cord 12, so that the AC cord 12 is not caught under the back cabinet 10. The AC cord 12 is drawn out from the front part of the bottom end of the back cabinet 10 and guided to the rear part of the bottom of the back cabinet 10 along the guide groove 11. The AC cord 12 drawn out from the rear part of the bottom of the back cabinet 10 is held by the hook body 1 in a state pulled upward.

Figure 5:
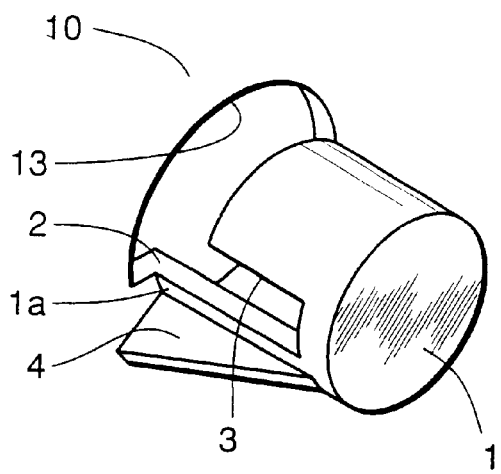
FIG. 5 is an enlarged perspective view of a portion 100 around a hook body provided on the back cabinet of the television set shown in FIG. 1.
Figure 6:
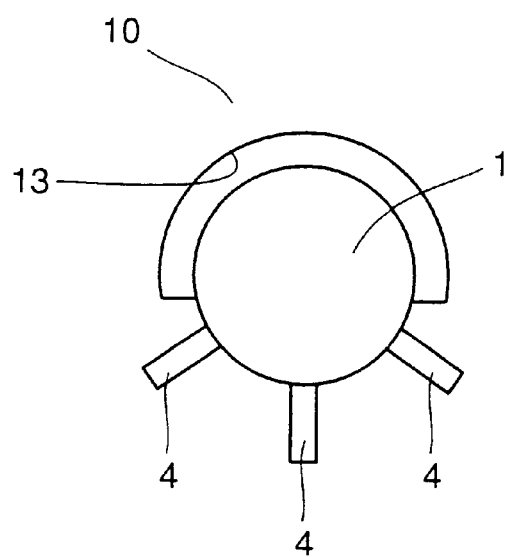
FIG. 6 is a front elevational view of the hook body shown in FIG. 5.
Figure 7:
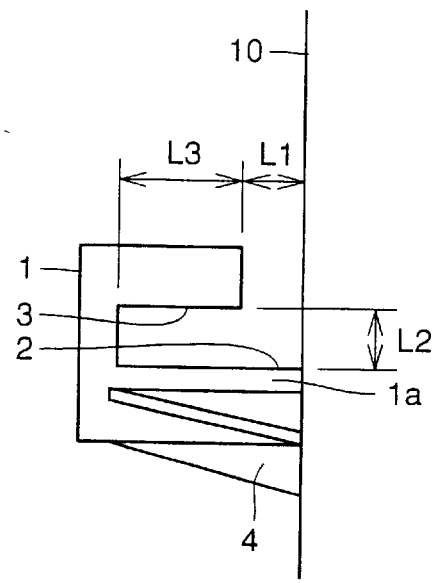
FIG. 7 is a side elevational view of the hook body shown in FIG. 5.
Figure 8:
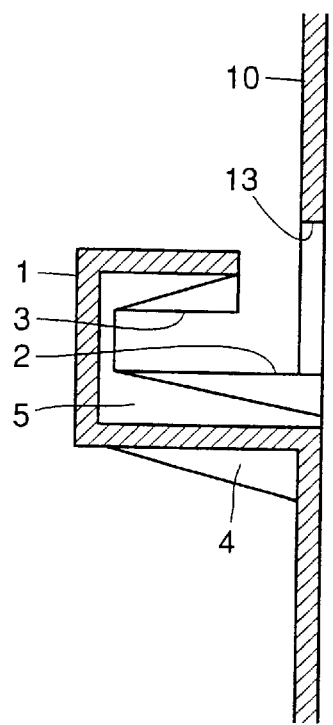
FIG. 8 is a side sectional view of the hook body shown in FIG. 5.

The structure of the hook body 1 in this embodiment is now described in detail with reference to FIGS. 5 to 10. A notched part 2 for receiving the AC cord 12 is formed on a base portion of the hook body 1. A recessed part 3 for holding the AC cord 12 is formed from the notched part 2 toward the forward end of the hook body 1. Three reinforcing ribs 4 are provided on the outer peripheral surface of the cylindrical portion of the hook body 1, as shown in FIGS. 5 to 7. Further, a single reinforcing rib 5 is provided along the inner surface of the cylindrical portion of the hook body 1, as shown in FIGS. 8 and 9.

Figure 9:
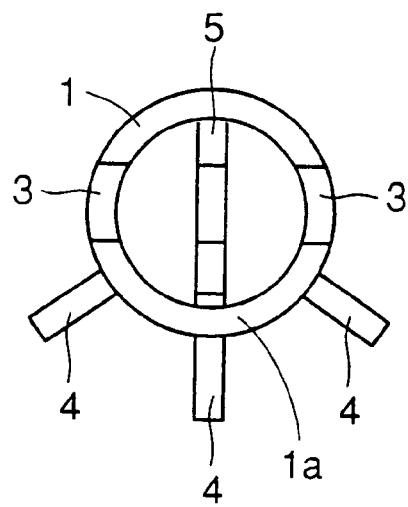
FIG. 9 illustrates the hook body shown in FIG. 5 as viewed from the rear side.

A lower end portion 1a closer to the base portion of the hook body 1 has a semi-cylindrical shape as shown in FIG. 9, and this semi-cylindrical lower end portion 1a is integrally connected to the back cabinet 10 as shown in FIG. 5. The back cabinet 10 is provided on a portion corresponding to the hook body 1 with an opening 13 shown in FIGS. 5 and 6. This opening 13 is necessary on a molding process as a hole for receiving a die part for molding the hook body 1 when integrally molding the hook body 1 and the back cabinet 10.

Figure 10:
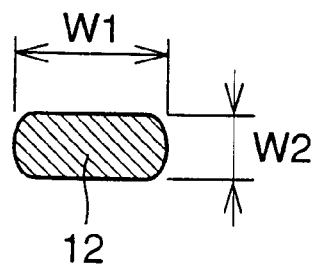
FIG. 10 is a sectional view for illustrating the sectional shape of an AC cord.

Referring to FIGS. 7 and 10, the length (L1) of the recess part 2 of the hook body 1 is slightly larger than the length (W2) of the AC cord 12 along the shorter side and smaller than the length (W1) of the AC cord 12 along the longer side. Further, the groove depth (L3) of the recessed part 3 is substantially identical to the length (W1) of the AC cord 12 along the longer side.

In the cord settler according to this embodiment, the hook body 1 is provided on the back of the back cabinet 10 of the television set on the position of a prescribed height from the bottom of the back cabinet 10, as described above. When the AC cord 12 is hung on the hook body 1, therefore, the AC cord 12 can be prevented from suspending. Thus, the AC cord 12 can be effectively prevented from being caught under the television set.

In this embodiment, further, the guide groove 11 is provided over the front part and the rear part of the bottom end of the back cabinet 10 as described above, whereby the AC cord 12 drawn out from the front part of the bottom end of the back cabinet 10 is readily guided to the rear part of the bottom of the back cabinet 10 along the guide groove 11 without being caught under the back cabinet 10. The AC cord 12 drawn out from the rear part of the bottom of the back cabinet 10 is held in the recessed part 3 of the hook body 1 in a state pulled upward, whereby the AC cord 12 can be prevented from suspending. Thus, the AC cord 12 can be prevented from being caught under the television set.

According to this embodiment, as hereinabove described, the AC cord 12 can be effectively prevented from being caught under the television set due to the interaction of the guide groove 11 and the recessed part 3 of the hook body 1.

According to this embodiment, the mechanical strength (strength against breaking or bending caused by pulling the AC cord 12) of the hook body 1 can be remarkably improved due to the cylindrical shape of the hook body 1 as compared with that formed in another shape. More specifically, when the hook body 1 formed in the cylindrical shape with a prescribed thickness and a prescribed width is compared with a hook body formed in an L shape with the same thickness and width, the mechanical strength of the former is at least four times that of the latter.

Also when the AC cord 12 hung on the hook body 1 is pulled, the hook body 1 can be effectively prevented from being broken or bent by forming the hook body 1 in the cylindrical shape having high mechanical strength.

In this embodiment, further, the recessed part 3 is so provided from the notched part 2 toward the forward end of the hook body 1 that it is possible to prevent the AC cord 12 from unexpected deviation by fitting the AC cord 12 in the recessed part 3. Consequently, the AC cord 12 can be held in a stable state.

According to this embodiment, the mechanical strength of the hook body 1 can be further improved by providing the three reinforcing ribs 4 on the outer peripheral surface of the cylindrical portion of the hook body 1 while providing the single reinforcing rib 5 also on the inner surface of the cylindrical portion of the hook body 1. Consequently, it is possible to further effectively prevent the hook body 1 from being broken or bent when the AC cord 12 hung on the hook body 1 is pulled.

According to this embodiment, it is possible to effectively prevent the hook body 1 from being broken along the lower end portion 1a thereof when the AC cord 12 hung on the hook body 1 is pulled by forming the lower end portion 1a closer to the base portion of the hook body 1 in the semi-cylindrical shape having high mechanical strength and integrally connecting the semi-cylindrical lower end portion 1a to the back cabinet 1.

The cord settler according to this embodiment is advantageously easy to mold since the forward end of the hook body 1 is formed in a cylindrical shape having a bottom and hence a male die and a female die will not come into contact with each other on the forward end of the hook body in molding. Further, the mechanical strength of the hook body 1 can be further improved by the aforementioned bottom.

A procedure of holding the AC cord 12 by the hook body 1 according to this embodiment is now described with reference to FIGS. 7 and 10 to 13.

Figure 11:
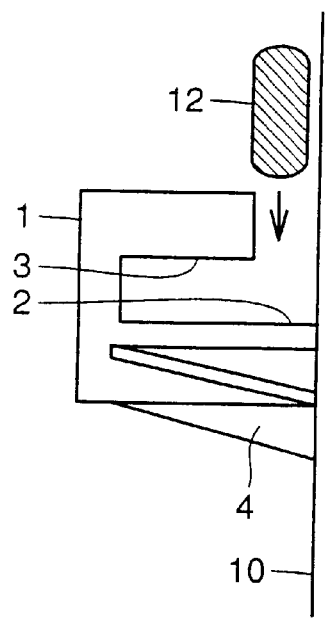
FIGS. 11 to 13 are side elevational views for illustrating a procedure of holding the AC cord in the hook body according to the embodiment.
Figure 12:
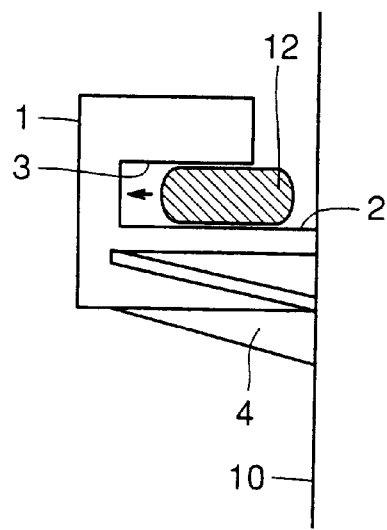

As shown in FIG. 10, the section of the AC cord 12 has a substantially rectangular shape having a shorter side and a longer side. As shown in FIGS. 7 and 10, the length (L1) of the notched part 2 of the hook body 1 is slightly larger than the length (W2) of the AC cord 12 along the shorter side and smaller than the length (W1) of the AC cord 12 along the longer side. Therefore, the AC cord 12 is inserted in the notched part 2 of the hook body 1 from the shorter side thereof, as shown in FIG. 11.

Figure 13:
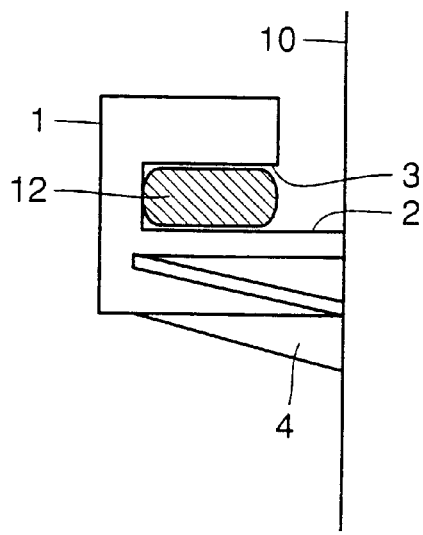

As shown in FIGS. 7 and 10, further, the groove width (L2) of the recessed part 3 is slightly larger than the length (W2) of the AC cord 12 along the shorter side thereof and smaller than the length (W1) of the AC cord 12 along the longer side thereof. Therefore, the AC cord 12 is rotated by 90° from the state shown in FIG. 11 and then fitted in the recessed part 3 from the shorter side thereof. Thus, the AC cord 12 is held in the recessed part 3 as shown in FIG. 13.

The groove width (L2) of the recessed part 3 is slightly larger than the length (W2) of the AC cord 12 along the shorter side thereof and hence the recessed part 3 holds the AC cord 12 with a slight clearance defined therebetween between. Thus, the recessed part 3 can be prevented from damaging the coating of the AC cord 12. When the AC cord 12 fitted in the recessed part 3 is pulled along arrow 200 (see FIG. 4), the AC cord 12 is twisted to fill up the clearance between the AC cord 12 and the recessed part 3. Also when the AC cord 12 is pulled, therefore, the AC cord 12 can be effectively prevented from deviation from the hook body 1. Consequently, the AC cord 12 can be stably held. The aforementioned arrow 200 (see FIG. 4) shows a direction where the AC cord 12 is pulled when the user moves the television set in a state socketing the forward end of the AC cord 12.

Figure 14:
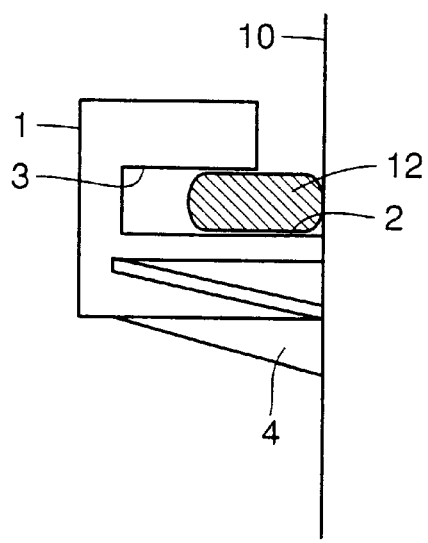
FIG. 14 is a side elevational view for illustrating an effect of holding the AC cord in the hook body according to the embodiment.

When the AC cord 12 moves from the recessed part 3 toward the notched part 2 as shown in FIG. 14, the forward end of the AC cord 12 is held in the recessed part 3 since the length (L1) of the notched part 2 is smaller than the length (W1) of the AC cord 12 along the longer side thereof. Consequently, the AC cord 12 can be effectively moved from deviation from the notched part 2 also when moving from the recessed part 3 toward the notched part 2. Thus, the AC cord 12 can be stably held.

Although the present invention has been described and illustrated in detail, it is clearly understood that the same is by way of illustration and example only and is not to be taken by way of limitation, the spirit and scope of the present invention being limited only by the terms of the appended claims.

While the forward end of the hook body 1 has a bottom in the aforementioned embodiment, for example, the present invention is not restricted to this but the forward end of the hook body 1 may have an open shape.

While the hook body 1 is cylindrically formed in the aforementioned embodiment, the present invention is not restricted to this but a similar effect can be attained with a hook body having a polygonal tubular shape which can be regarded as substantially cylindrical.

While the cord settler according to the present invention is applied to a television set such as a general television or a television provided with a video recorder in the aforementioned embodiment, the present invention is not restricted to this but a similar effect can be attained by applying the present invention to another electric apparatus.

What is claimed is:

1. A cord settler comprising:
   a hook body, said hook body having a forward end, said forward end of the hook body formed in a cylindrical shape, formed on the back of a back cabinet of a television set on a position of a prescribed height from the bottom of said back cabinet integrally with said back cabinet;
   a notched part formed on a base portion of said hook body for receiving a cord; and
   a recessed part formed from said notched part of said hook body toward the forward end of said hook body for holding said cord.

2. The cord settler in accordance with claim 1, wherein
   a reinforcing rib is provided on the outer peripheral surface of the cylindrical portion of said hook body.

3. The cord settler in accordance with claim 1, wherein
   a reinforcing rib is provided on the inner surface of the cylindrical portion of said hook body.

4. The cord settler in accordance with claim 1, wherein the hook body comprises a base part, said base part of said hook body has a substantially semi-cylindrical shape, and
   the base part having said semi-cylindrical shape is integrally connected to said back cabinet.

5. The cord settler in accordance with claim 1, further comprising a guide groove formed over a bottom front part and a bottom rear part of said back cabinet for guiding said cord, wherein
   said cord is drawn out from said bottom front part of said back cabinet, guided to said bottom rear part of said back cabinet along said guide groove and thereafter held in said recessed part of said hook body.

6. The cord settler in accordance with claim 1, wherein
   the section of said cord has a substantially rectangular shape having a shorter side and a longer side, and
   the length of said notched part is larger than the length of said cord along said shorter side and smaller than the length of said cord along said longer side.

7. The cord settler in accordance with claim 1, wherein the section of said cord has a substantially rectangular shape having a shorter side and a longer side, and
   the width of said recessed part is larger than the length of said cord along said shorter side and smaller than the length of said cord along said longer side.

8. The cord settler in accordance with claim 1, wherein
   the section of said cord has a substantially rectangular shape having a shorter side and a longer side, and
   the length of said recessed part is substantially equal to the length of said cord along said longer side.

9. The cord settler in accordance with claim 1, wherein
   an opening is formed on a portion of said back cabinet corresponding to said hook body.

10. A cord settler comprising:
    a hook body, said hook body having a forward end, said forward end of the hook body formed in a cylindrical shape, formed on the back of an apparatus body of an electric apparatus on a position of a prescribed height from the bottom of aid apparatus body integrally with said apparatus body;
    a notched part formed on a base portion of said hook body for receiving a cord; and
    a recessed part formed from said notched part of said hook body toward the forward end of said hook body for holding said cord.

* * * * *